US012635434B2

(12) United States Patent
Zhang et al.

(10) Patent No.: US 12,635,434 B2
(45) Date of Patent: May 19, 2026

(54) HIGH ASPECT RATIO CONTACT ETCHING WITH ADDITIVE GAS

(71) Applicant: Tokyo Electron Limited, Tokyo (JP)

(72) Inventors: Du Zhang, Albany, NY (US); Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 313 days.

(21) Appl. No.: 18/191,098

(22) Filed: Mar. 28, 2023

(65) Prior Publication Data

US 2024/0332029 A1     Oct. 3, 2024

(51) Int. Cl.
  *H01L 21/311*     (2006.01)
  *H01L 21/02*     (2006.01)
  *H01L 21/033*     (2006.01)
(52) U.S. Cl.
  CPC .. *H01L 21/31144* (2013.01); *H01L 21/02211* (2013.01); *H01L 21/0332* (2013.01); *H01L 21/0337* (2013.01); *H01L 21/31116* (2013.01)
(58) Field of Classification Search
  None
  See application file for complete search history.

(56) References Cited

U.S. PATENT DOCUMENTS

| | | | | |
|---|---|---|---|---|
| 9,543,148 | B1 * | 1/2017 | Hudson | ............. H01L 21/67069 |
| 9,673,058 | B1 | 6/2017 | Briggs et al. | |
| 10,283,370 | B1 | 5/2019 | Ros Bengoechea et al. | |
| 10,361,092 | B1 | 7/2019 | Roberts | |

| | | | | |
|---|---|---|---|---|
| 10,418,250 | B2 | 9/2019 | Kim et al. | |
| 10,847,377 | B2 | 11/2020 | Dole et al. | |
| 2003/0232504 | A1 * | 12/2003 | Eppler | .............. H01L 21/32136 |
| | | | | 257/E21.252 |
| 2004/0115885 | A1 | 6/2004 | Park et al. | |
| 2010/0105208 | A1 | 4/2010 | Winniczek | |
| 2019/0206723 | A1 * | 7/2019 | Tokashiki | ......... H01L 21/30655 |
| 2021/0005472 | A1 * | 1/2021 | Kanarik | ............ H01L 21/67109 |
| 2022/0020601 | A1 | 1/2022 | Toda et al. | |

(Continued)

FOREIGN PATENT DOCUMENTS

WO          2022182641 A1     9/2022

OTHER PUBLICATIONS

Kalanyan et al., "Using Hydrogen to Expand the Inherent Substrate Selectivity Window During Tungsten Atomic Layer Deposition," Chemistry of Materials, vol. 28, No. 1, pp. 117-126, Dec. 15, 2015, https://doi.org/10.1021/acs.chemmater.5b03319, 10 pages total.

(Continued)

*Primary Examiner* — Roberts P Culbert
(74) *Attorney, Agent, or Firm* — Slater Matsil, LLP

(57) ABSTRACT

A method of processing a substrate that includes: flowing a fluorocarbon, a metal halide, and dihydrogen ($H_2$) into a plasma processing chamber, the plasma processing chamber configured to hold a substrate including a dielectric layer including silicon oxide as an etch target and a patterned hardmask including polycrystalline silicon (poly-Si) over the dielectric layer; while flowing the gases, generating a plasma in the plasma processing chamber; and forming a high aspect ratio feature by exposing the substrate to the plasma to etch a recess in the dielectric layer, where a metal-containing passivation layer is formed over the patterned hardmask during the exposing.

22 Claims, 8 Drawing Sheets

60

(56)         References Cited

U.S. PATENT DOCUMENTS

| | | | |
|---|---|---|---|
| 2022/0093367 A1* | 3/2022 | Tanaka .............. | H01J 37/32495 |
| 2022/0139719 A1 | 5/2022 | Chino | |
| 2022/0351980 A1 | 11/2022 | Hasso | |

OTHER PUBLICATIONS

International Search Report and Written Opinion, PCT Application No. PCT/US2024/010623, mailed Apr. 30, 2024, 12 pages.

* cited by examiner

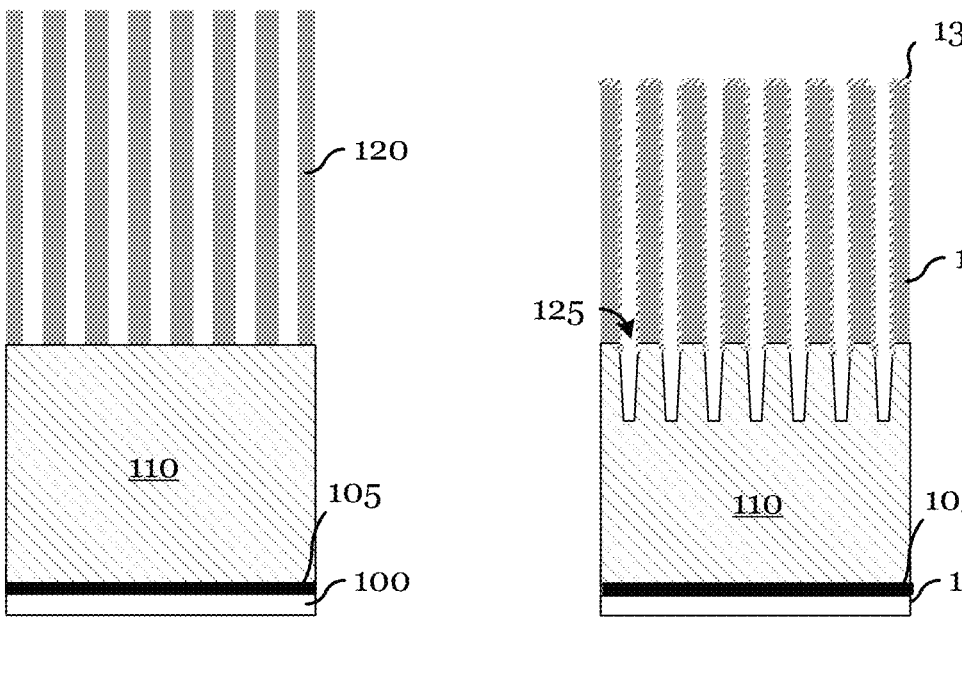
FIG. 1A                    FIG. 1B
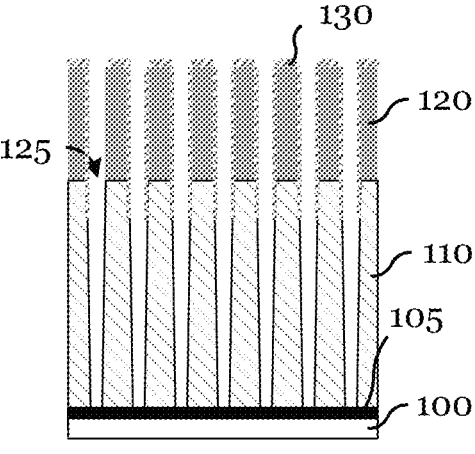
FIG. 1C

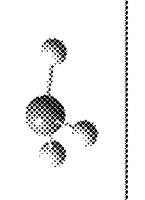
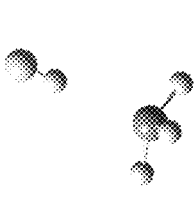
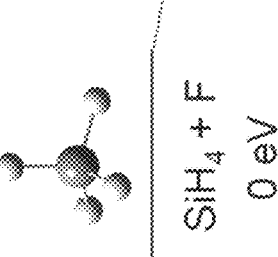
$SiH_3 + HF$
-1.302 eV
$SiH_3 \ldots HF$
-1.418 eV
$SiH_4 + F$
0 eV
FIG. 5

60

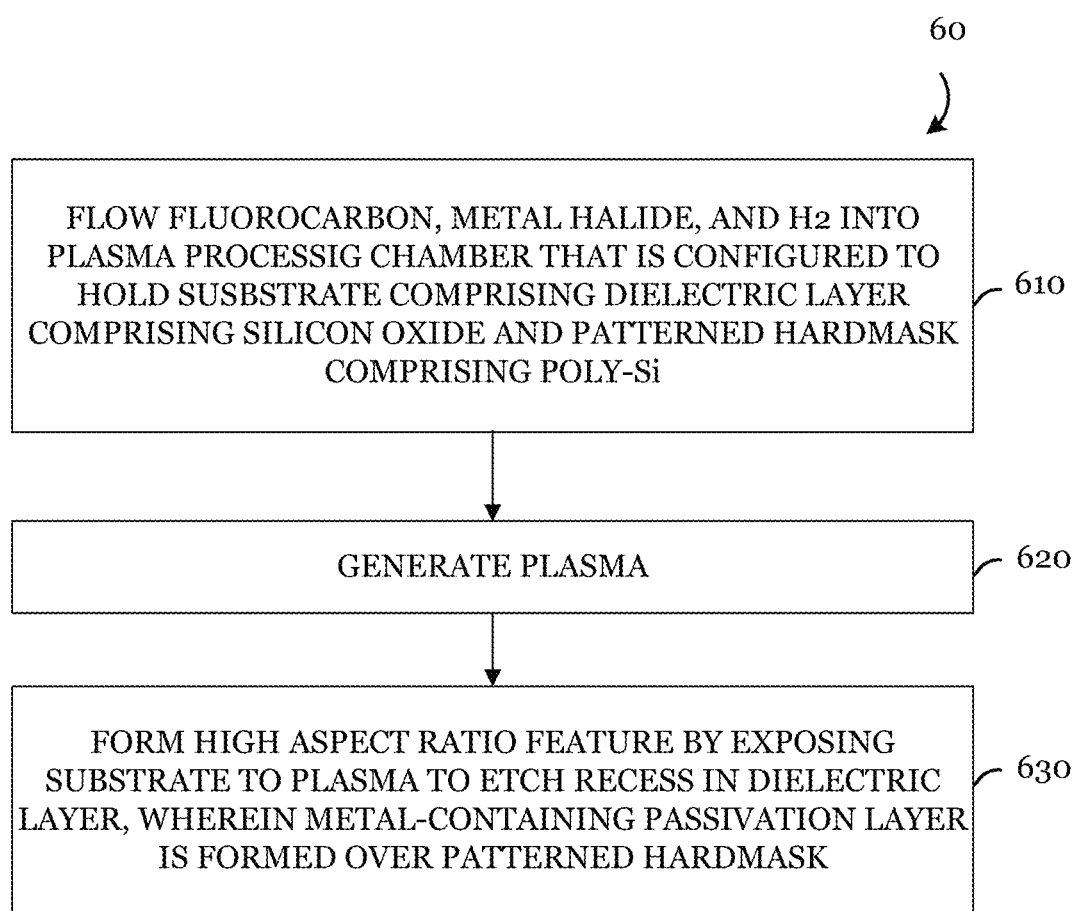

FLOW FLUOROCARBON, METAL HALIDE, AND H2 INTO PLASMA PROCESSIG CHAMBER THAT IS CONFIGURED TO HOLD SUSBSTRATE COMPRISING DIELECTRIC LAYER COMPRISING SILICON OXIDE AND PATTERNED HARDMASK COMPRISING POLY-Si — 610

GENERATE PLASMA — 620

FORM HIGH ASPECT RATIO FEATURE BY EXPOSING SUBSTRATE TO PLASMA TO ETCH RECESS IN DIELECTRIC LAYER, WHEREIN METAL-CONTAINING PASSIVATION LAYER IS FORMED OVER PATTERNED HARDMASK — 630

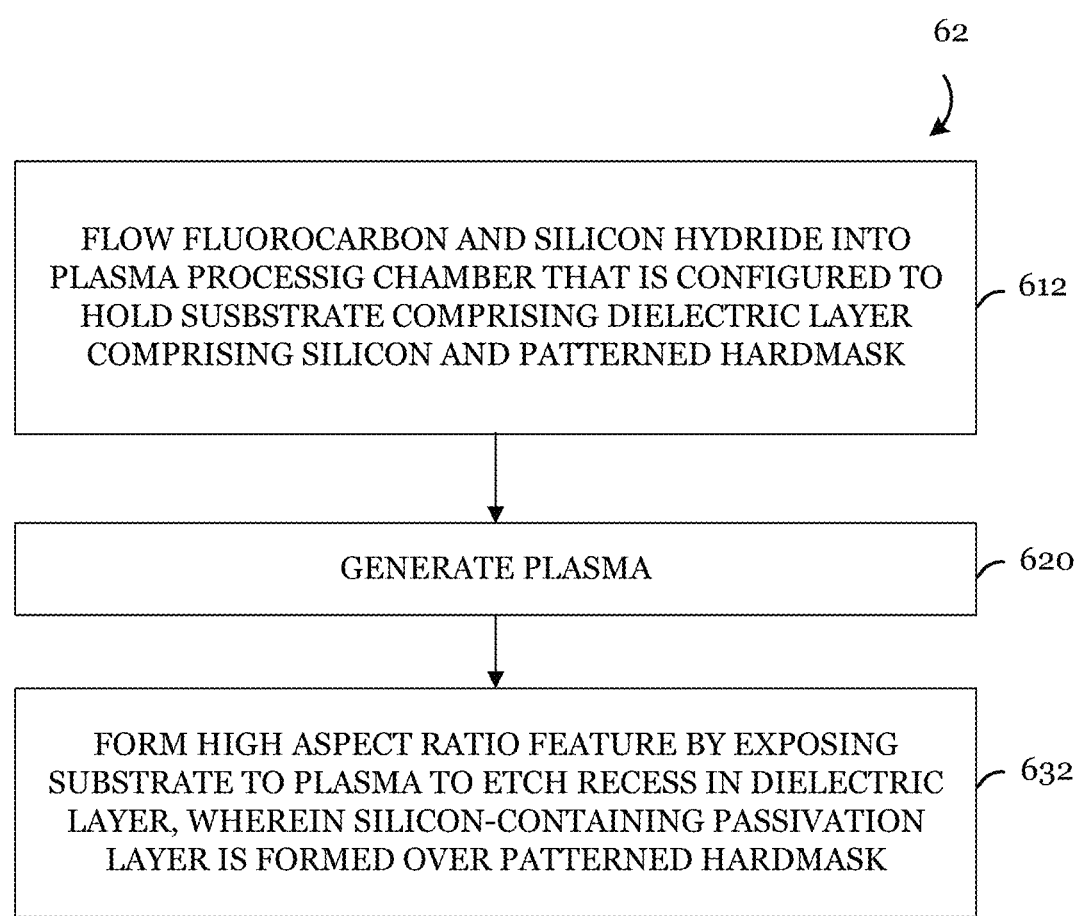

FLOW FLUOROCARBON AND SILICON HYDRIDE INTO PLASMA PROCESSIG CHAMBER THAT IS CONFIGURED TO HOLD SUSBSTRATE COMPRISING DIELECTRIC LAYER COMPRISING SILICON AND PATTERNED HARDMASK — 612

GENERATE PLASMA — 620

FORM HIGH ASPECT RATIO FEATURE BY EXPOSING SUBSTRATE TO PLASMA TO ETCH RECESS IN DIELECTRIC LAYER, WHEREIN SILICON-CONTAINING PASSIVATION LAYER IS FORMED OVER PATTERNED HARDMASK — 632

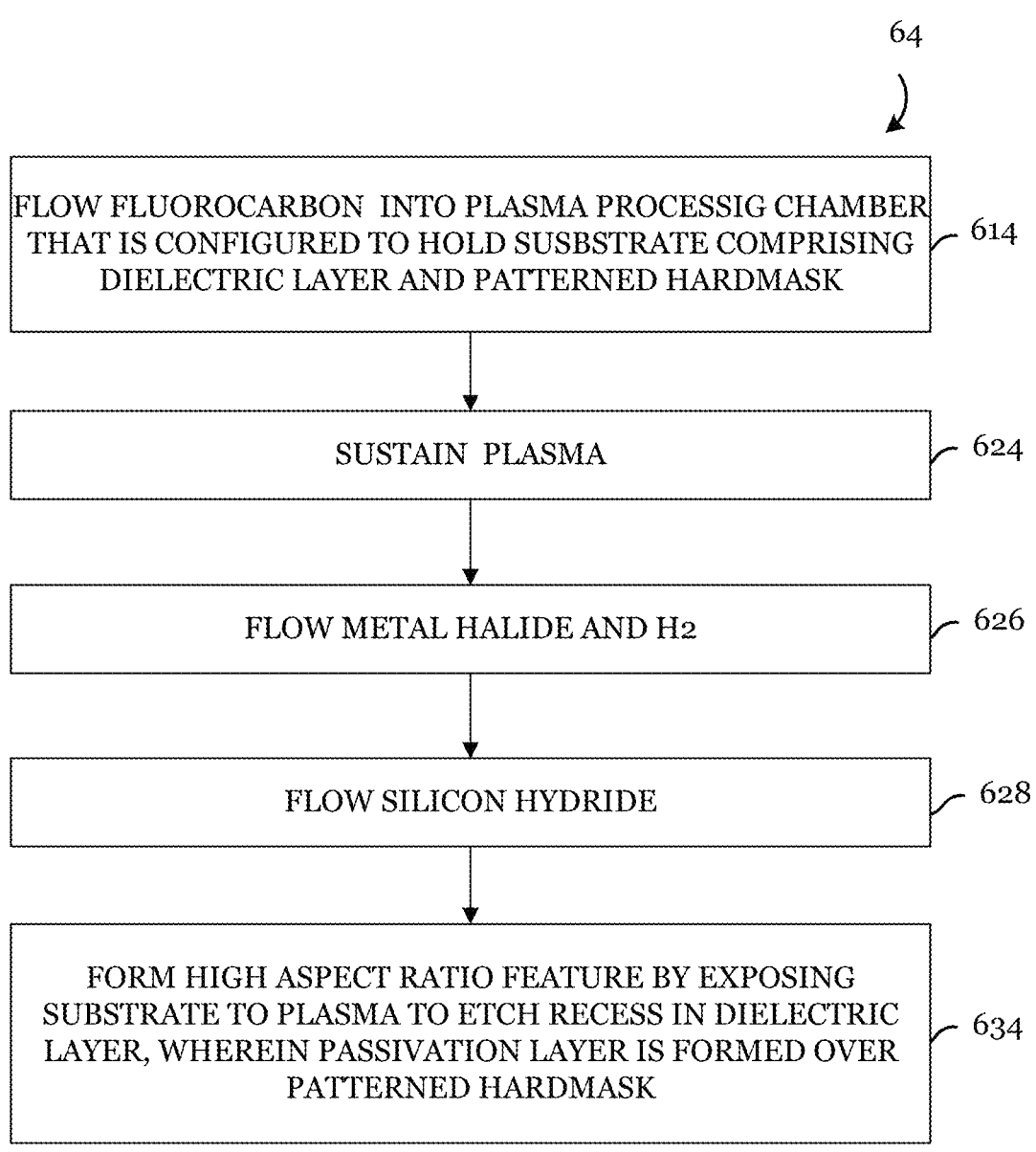

FLOW FLUOROCARBON INTO PLASMA PROCESSIG CHAMBER THAT IS CONFIGURED TO HOLD SUSBSTRATE COMPRISING DIELECTRIC LAYER AND PATTERNED HARDMASK — 614

SUSTAIN PLASMA — 624

FLOW METAL HALIDE AND H2 — 626

FLOW SILICON HYDRIDE — 628

FORM HIGH ASPECT RATIO FEATURE BY EXPOSING SUBSTRATE TO PLASMA TO ETCH RECESS IN DIELECTRIC LAYER, WHEREIN PASSIVATION LAYER IS FORMED OVER PATTERNED HARDMASK — 634

FIG. 6C

HIGH ASPECT RATIO CONTACT ETCHING WITH ADDITIVE GAS

TECHNICAL FIELD

The present invention relates generally to methods of processing a substrate and, in particular embodiments, to high aspect ratio contact (HARC) etching with additive gas.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes.

The semiconductor industry has repeatedly reduced the minimum feature sizes in semiconductor devices to a few nanometers to increase the packing density of components. Accordingly, the semiconductor industry increasingly demands plasma processing technology to provide processes for patterning features with accuracy, precision, and profile control, often at atomic scale dimensions. Meeting this challenge along with the uniformity and repeatability needed for high volume IC manufacturing requires further innovations of plasma processing technology.

SUMMARY

In accordance with an embodiment of the present invention, a method of processing a substrate that includes: flowing a fluorocarbon, a metal halide, and dihydrogen ($H_2$) into a plasma processing chamber, the plasma processing chamber configured to hold a substrate including a dielectric layer including silicon oxide as an etch target and a patterned hardmask including polycrystalline silicon (poly-Si) over the dielectric layer; while flowing the gases, generating a plasma in the plasma processing chamber; and forming a high aspect ratio feature by exposing the substrate to the plasma to etch a recess in the dielectric layer, where a metal-containing passivation layer is formed over the patterned hardmask during the exposing.

In accordance with an embodiment of the present invention, a method of processing a substrate that includes: flowing a fluorocarbon and a silane compound into a plasma processing chamber, the plasma processing chamber configured to hold a substrate including a dielectric layer including silicon as an etch target and a patterned hardmask including over the dielectric layer; while flowing the gases, generating a plasma in the plasma processing chamber; and forming a high aspect ratio feature by exposing the substrate to the plasma to etch a recess in the dielectric layer, where a silicon-containing passivation layer is formed over the patterned hardmask during the exposing.

In accordance with an embodiment of the present invention, a method of processing a substrate that includes: flowing a fluorocarbon into a plasma processing chamber, the plasma processing chamber configured to hold a substrate including a dielectric layer as an etch target and a patterned hardmask over the dielectric layer; while flowing the fluorocarbon, sustaining a plasma generated from the fluorocarbon in the plasma processing chamber; while sustaining the plasma, flowing a metal halide and dihydrogen ($H_2$) into the plasma processing chamber; while sustaining the plasma, flowing a silane compound into the plasma processing chamber; and forming a high aspect ratio feature by exposing the substrate to the plasma to etch a recess in the dielectric layer, where a passivation layer is formed over the patterned hardmask during the exposing.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1C illustrate cross sectional views of an example substrate during a process of semiconductor fabrication comprising a plasma etch process to form a high aspect ratio (HAR) feature in accordance with various embodiments, wherein FIG. 1A illustrates an incoming substrate comprising a patterned hardmask layer, a dielectric layer, and an etch stop layer (ESL), FIG. 1B illustrates the substrate during the formation of the HAR feature by the plasma etch process, and FIG. 1C illustrates the substrate after completing the plasma etch process;

FIG. 5 illustrates an energy level diagram for formation of a deposition precursor ($SiH_3$) from a silane species ($SiH_4$) via a heavy-particle-assisted dissociation;

FIGS. 6A-6C illustrate process flow diagrams of methods of a plasma etch process to form HAR features in accordance with various embodiments, wherein FIG. 6A illustrates an embodiment, FIG. 6B illustrates an alternate embodiment, and FIG. 6C illustrates yet another embodiment.

DETAILED DESCRIPTION OF ILLUSTRATIVE EMBODIMENTS

This application relates to fabrication of semiconductor devices, for example, integrated circuits comprising semiconductor devices, and more particularly to high capacity three-dimensional (3D) memory devices, such as a 3D-NAND (or vertical-NAND), 3D-NOR, or dynamic random access memory (DRAM) device. The fabrication of such devices may generally require forming conformal, high aspect ratio (HAR) features (e.g., a contact hole) of a circuit element. Features with aspect ratio (ratio of height of the feature to the width of the feature) higher than 50:1 are generally considered to be high aspect ratio features, and in some cases fabricating a higher aspect ratio such as 100:1 may be desired for advanced 3D semiconductor devices. However, conventional HAR etch methods may usually comprise tens and sometimes hundreds of processing steps, for example employed as a cyclic process, which thereby complicates the process optimization and lowers etch throughput. Furthermore, conventional HAR etch methods may often suffer severe distortion and twisting in the final structures. Accordingly, the issues of low wafer throughput, poor uniformity, and missing contact remains challenging for HAR etch processes. A simple yet effective HAR process may therefore be desired. Embodiments of the present application disclose methods of fabricating HAR features by a plasma etch process based on a fluorocarbon enhanced by an additive gas such as metal fluoride and silane compounds. HAR features with aspect ratios, higher than 50:1, e.g., between 50:1 and 200:1 may be fabricated using embodiments discussed in this application.

The methods of plasma etch described in this disclosure may overcome various challenges posed for plasma etching processes for HAR features. In various embodiments, the plasma etch process may advantageously achieve a high AR equal to or higher than 100:1 with a good selectivity to a hardmask. In particular, the additive gas may improve the mask selectivity (e.g., the etch selectivity to a mask comprising polycrystalline silicon) by providing a metal- or silicon-containing passivation layer selectively over the mask. The methods may be used to etch a dielectric layer such as silicon oxide with the improved selectivity while maintaining a good etch rate. This plasma etch process according to the methods may also be performed in a single step rather than a cyclic etch process that requires multiple steps.

Figure 7:
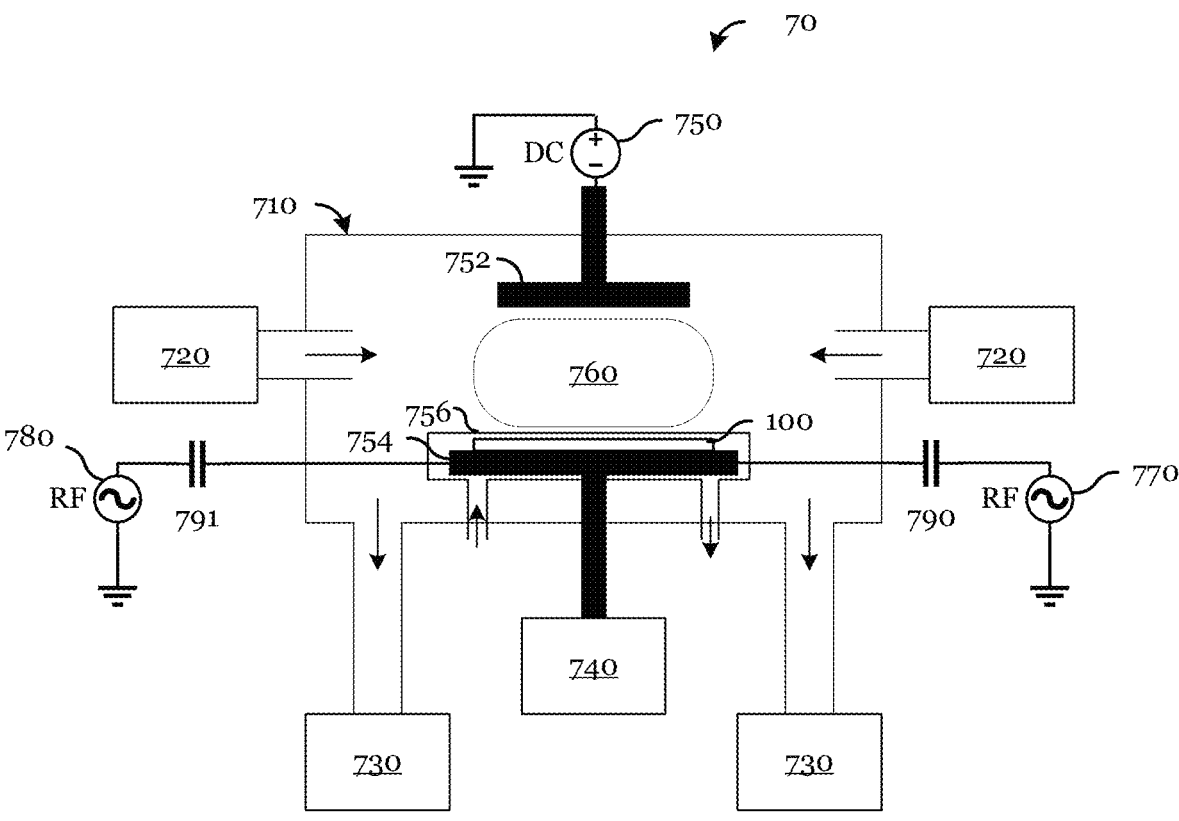
FIG. 7 illustrates an example plasma processing tool in accordance with an embodiment of this disclosure.

In the following, an exemplary plasma etch process assisted by an additive gas to form a desired high aspect ratio (HAR) feature will be discussed with FIGS. 1A-1C in accordance with various embodiments. The selective deposition of a metal-containing passivation layer over a hardmask relative to an etch target is described with calculated formation energy of a deposit precursor referring to FIGS. 2 and 3. Possible reaction pathways for the formation of a metal- or silicon-containing deposit precursor are described referring to FIGS. 4 and 5. Example process flow diagrams are then illustrated in FIG. 6A-6C. An example capacitively coupled plasma (CCP) processing tool for the embodiment methods is illustrated in FIG. 7. All figures are drawn for illustration purpose only and not to scale.

FIG. 1A illustrates a cross-sectional view of an example incoming substrate 100 comprising a dielectric layer 110 and a patterned hardmask layer 120 in accordance with various embodiments.

In one or more embodiments, the substrate 100 may be a silicon wafer, or a silicon-on-insulator (SOI) wafer. In certain embodiments, the substrate may comprise a silicon germanium wafer, silicon carbide wafer, gallium arsenide wafer, gallium nitride wafer and other compound semiconductors. In other embodiments, the substrate comprises heterogeneous layers such as silicon germanium on silicon, gallium nitride on silicon, silicon carbon on silicon, as well as layers of silicon on a silicon or SOI substrate.

In various embodiments, the substrate 100 is a part of, or includes, a semiconductor device, and may have undergone a number of steps of processing following, for example, a conventional process. For example, the semiconductor structure may comprise the substrate 100 in which various device regions are formed. At this stage, the substrate 100 may include isolation regions such as shallow trench isolation (STI) regions as well as other regions formed therein. In various embodiments, high aspect ratio (HAR) features may be formed on the substrate 100 by the methods of plasma etch described in this disclosure and subsequently used to fabricate a 3D memory device, such as a 3D-NAND (or vertical-NAND), 3D-NOR, or dynamic random access memory (DRAM).

The dielectric layer 110 may be formed over the substrate 100. In various embodiments, the dielectric layer 110 is a target layer that is to be patterned into one or more high aspect ratio (HAR) features. In certain embodiments, the HAR feature being etched into the dielectric layer 110 may be a contact hole, slit, or other suitable structures comprising a recess. In certain embodiments, the dielectric layer 110 may be a silicon oxide layer or other layers that might be useful for a DRAM. In alternate embodiments, the dielectric layer 110 may comprise silicon nitride, silicon oxynitride, an O/N/O/N layer stack (stacked layers of oxide and nitride), or any suitable materials that might be used, e.g., in a 3D-NAND stack. The dielectric layer 110 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the dielectric layer 110 has a thickness between 1 µm and 10 µm. In another embodiment, the dielectric layer 110 may comprise a layer stack with each layer of the stack having a thickness between 50 nm and 2.5 µm.

In certain embodiments, the substrate 100 may further comprise an etch stop layer (ESL) 105 between the substrate 100 and the dielectric layer 110. The ESL 105 may comprise a dielectric material that provides a high etch selectivity during the plasma etch process (e.g., FIG. 1C) in order to prevent undesired damage to the substrate 100. In various embodiments, the ESL is merely optional and may be absent over the substrate 100, where the substrate 100 itself can etch stop during the plasma etch process.

Still referring to FIG. 1A, the patterned hardmask layer 120 is formed over the dielectric layer 110. In various embodiments, the patterned hardmask layer 120 may comprise polycrystalline silicon (poly-Si). In one or more embodiments, the patterned hardmask layer 120 may comprise spin-on carbon, tungsten carbide, boron carbide, or other suitable mask materials. Although not illustrated in FIG. 1A, the patterned hardmask layer 120 may comprise a layer stack of different materials, for example, poly-Si and another material. The patterned hardmask layer 120 may be formed by first depositing a hardmask layer using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. The deposited hardmask layer may then be patterned using a lithography process and an anisotropic etch process, for example, using oxygen-based etch chemistry. The relative thicknesses of the patterned hardmask layer 120 and the dielectric layer 110 may have any suitable relationship. For example, the patterned hardmask layer 120 may be thicker than the dielectric layer 110, thinner than the dielectric layer 110, or the same thickness as the dielectric layer 110. In certain embodiments, the patterned hardmask layer 120 has a thickness between 1 µm and 4 µm. In one embodiment, the patterned hardmask layer 120 comprises poly-Si and has a thickness of 2.5 µm and a critical dimension (CD) of 75 nm, although in other embodiments, the thickness and the CD of the patterned hardmask layer 120 may have any suitable values, respectively.

The patterned hardmask layer 120 and the dielectric layer 110 may be collectively considered as a part of the substrate 100. Further, the substrate 100 may also comprise other layers. For example, for the purpose of patterning the hardmask layer, a tri-layer structure comprising a photoresist layer, SiON layer, and optical planarization layer (OPL) may be present.

FIG. 1B illustrates the substrate 100 during the formation of the HAR feature by the plasma etch process.

Fabricating the HAR feature in the dielectric layer 110 may be performed by a plasma etch process using a combination of process gases that includes an additive gas for passivation in accordance with various embodiments.

The plasma etch process may comprise a reactive ion etching (RIE) process that uses a halogen-containing etch gas. In various embodiments, the etch gas may comprise a hydrofluorocarbon, a combination of a hydrocarbon and a fluorine-containing gas, or a combination of a fluorocarbon and a hydrogen-containing gas. In certain embodiments, one or more fluorocarbons may be used as a primary etch gas. In one embodiment, a saturated fluorocarbon, an unsaturated fluorocarbon, or a combination thereof may be included in a process gas. In this disclosure, an unsaturated fluorocarbon refers to any compound comprising carbon and fluorine with at least one carbon-carbon double bond ($C=C$ bond) or triple bond ($C\equiv C$ bond), and a saturated fluorocarbon refers to any compound comprising carbon and fluorine without any $C=C$ bond or $C\equiv C$ bond. Examples of the unsaturated fluorocarbon and saturated fluorocarbon include but are not limited to hexafluorobutadiene ($C_4F_6$), hexafluoro-2-butyne ($C_4F_6$), and hexafluorocyclobutene ($C_4F_6$), and octafluoropropane ($C_3F_8$), perfluorobutane ($C_4F_{10}$), and perflenapent ($C_5F_{12}$), respectively.

In certain embodiments, other gases such as an inert gas (e.g., Ar, He, or $N_2$) or a balancing agent (e.g., $O_2$ or CO) may also be added to the process gas. In various embodiments, one or more balancing agents may be included in the process gas for the plasma etch process in order to control the degree of a polymer deposition. Generally, some polymer deposition may be beneficial to provide sidewall passivation for the mask and etch target, but an excessive deposition may lead to slower etch rate, irregularities of etch profile and even clogging. Therefore, the polymer deposition may need to be adequately tuned, for example using a balancing agent, to achieve a good balance between the sidewall passivation and the etch rate/profile.

In this disclosure, any list that presents possible compositions, conditions, or process variations includes any reasonable combination thereof, and thus the term "or" used in the list does not indicate any exclusive selection of a particular composition, condition, or process variation. For example, in certain embodiments, argon (Ar) and dioxygen ($O_2$) may be included as the inert gas and the balancing agent, respectively. In another embodiment, dinitrogen ($N_2$) and $O_2$ may be included in the process gas.

In alternate embodiments, the combination of gases may further comprise a third fluorocarbon. In one embodiment, the third fluorocarbon may be octafluorocyclobutane ($C_4F_8$), octafluoro-2-butene ($C_4F_8$), hexafluoropropylene ($C_3F_6$), carbon tetrafluoride ($CF_4$), or fluoroform ($CHF_3$). While above examples are primarily fluorine-based etch gases, other halogen-containing gases may also be used (e.g., $BCl_3$, $Cl_2$, and HBr).

Although carbon and fluorine species from these primary etch gases may form a polymer layer deposited on surface and may provide some degree of passivation, the inventors of this application identified that the etch process may still suffer from the issues such as insufficient mask selectivity and bowing. For example, bowing may still occur especially if the etch process time is elongated to increase the aspect ratio of the feature.

To improve the plasma etch process, various embodiments of the methods of this disclosure use incorporating an additive gas for better passivation. In various embodiments, the additive gas may comprise a mixture of metal halide and a hydrogen-containing gas, or a silane compound (silanes). In this disclosure, silane compound and silanes refer to a general class of compounds comprising silicon and are distinguished from $SiH_4$, which is referred to as monosilane in this disclosure. The metal halide may comprise a refractory metal. In certain embodiments, the metal halide may comprise tungsten hexafluoride ($WF_6$), molybdenum hexafluoride ($MoF_6$), niobium hexafluoride ($NbF_6$), or tungsten hexachloride ($WCl_6$). In other embodiments, the metal halide may comprise aluminum or titanium, for example aluminum trichloride ($AlCl_3$) or titanium tetrachloride ($TiCl_4$) in one embodiment. In one or more embodiments, the hydrogen-containing gas may comprise dihydrogen ($H_2$), hydrogen fluoride (HF), hydrogen bromide (HBr), or methane ($CH_4$). In various embodiments, the silane compound may comprise monosilane ($SiH_4$), disilane ($Si_2H_6$), or halogenated silane ($SiH_xX_y$).

Although not wishing to be limited by any theory, as further described below referring to FIGS. 5 and 6, the use of the hydrogen-containing gas (e.g., $H_2$) in addition to the metal halide (e.g., $WF_6$) may advantageously enhance the formation of deposition precursors via heavy-particle-assisted dissociation. In contrast, such a secondary additive (e.g., $H_2$) may be omitted when using the silane compound as other plasma species (e.g., fluorine species) may sufficiently induce the heavy-particle-assisted dissociation.

In one embodiment, the plasma etch process may be an oxide etch to etch silicon oxide using a poly-Si as an etch mask and an etch process gas comprising $C_4F_8$, $C_4F_6$, $C_3F_8$, $O_2$, $NF_3$, $WF_6$, and $H_2$. In another embodiment, the plasma etch process may be the same oxide etch but the etch process gas may comprise comprising $C_4F_8$, $C_4F_6$, $C_3F_8$, $O_2$, $NF_3$, and $SiH_4$.

To advantageously affect the plasma etch process, only a small amount of additive gas may be needed. In various embodiments, the flow rate of the metal halide (e.g., $WF_6$) may be less than 1% of the total process gas flow rate, for example, between 0.01% and 1%. In certain embodiments, it may be less than 0.3% of the total process gas flow rate. In another embodiment, the flow rate of the metal halide may be determined in relation to one component of the primary etch gas (e.g., a fluorocarbon), for example between 1% and 5% of a flow rate of the component. An excessive amount of the metal halide (e.g., >5% of the total gas flow) may lead to an undesired deposit on the substrate, chamber walls, and other surfaces in the equipment, and thereby a minimal amount of the metal halide addition may be used in various embodiments.

In various embodiments, gas flow rates may be mass basis and controlled by one or more mass flow controllers at a gas inlet system to introduce the gas to a plasma processing chamber. Accordingly, unless otherwise noted, gas flow rates refer to those at the point of entry to the plasma processing chamber.

In certain embodiments, the flow rate of the metal halide (e.g., $WF_6$) is less than 2 sccm, for example between 0.1 sccm and 2 sccm. In certain embodiments, the additive gas may be pulsed into the plasma processing chamber instead of a constant flow, which may enable introducing a gas amount that is less than a lower limit of a constant flow rate provided by a mass flow controller.

Still referring to FIG. 1B, recesses 125 may be formed in the dielectric layer 110 by the plasma etch process. The recesses 125 may be in any shapes and structures, for example designed to fabricate a contact hole, slit, or other suitable structures comprising a recess useful for semiconductor device fabrication. In various embodiments, the features defined by the recesses 125 has a critical dimension (CD) of 200 nm or less. In certain embodiments, the CD may be between 50 nm and 200 nm. For example, the feature may comprise a slit with a CD of about 150 nm. In alternate embodiments, the recesses 125 may comprise a hole that has a top opening with a diameter of 80 nm or less.

As illustrated in FIG. 1B, a passivation layer 130 may be formed over the patterned hardmask layer 120. In various embodiments, the additive gas may alter the chemical composition of the passivation layer 130 and lead to an improved mask selectivity and overall etch performance. In general, depending on the type of the additive gas (i.e., metal- or silicon-containing), the passivation layer 130 may comprise metal or silicon. For example, metal or silicon species may be incorporated into the carbonaceous polymeric layer. Alternately, the passivation layer may comprise metal fluoride or silicon fluoride. The passivation layer 130 may cover the entirety of the top surface and sidewalls of the patterned hardmask layer 120 as illustrated in FIG. 1B. In certain embodiments, the passivation layer 130 may be selectively deposited over the patterned hardmask layer 120 and not over the surface of the dielectric layer 110 within the recesses 125, but in other embodiments, it may also be deposited over a portion of the surface of the dielectric layer 110.

FIG. 1C illustrates the substrate 100 after completing the plasma etch process.

Continuing the plasma etch process, the recesses 125 illustrated in FIG. 1B may be extended further by etching through the entire thickness of the target layer (i.e., the dielectric layer 110) and reach/land to the top surface of the ESL 105 as illustrated in FIG. 1C.

In certain embodiments, although not illustrated in FIG. 1C, a polymeric passivation layer comprising carbon and fluorine may still occur over the surface of the dielectric layer 110 within the recesses 125 that can provide some degree of sidewall protection. In one embodiment, the polymer deposition on the exposed surface of the ESL 105 may advantageously enhance the etch stop ability of the ESL 105.

In various embodiments, the HAR feature with a high critical dimension uniformity (CDU) and a good sidewall passivation may be obtained (e.g., FIGS. 1B and 1C). Various process parameters and processing systems for the methods may be selected such that the plasma etching conditions are suitable for fabricating a HAR feature. Factors to be considered may include controlled level of deposition, mask selectivity, sidewall passivation in the HAR feature, and good CDU among others. In certain embodiments, the plasma etch process may be advantageously performed as a single step process to form a high aspect ratio (HAR) feature with an aspect ratio of 100:1 or higher. While a continuous process flow for the plasma etch process may be advantageous, other embodiments where the methods are applied as a part of a cyclic or multi-step process may also be possible.

In various embodiments, a RF pulsing at a kHz range may be used to power the plasma. Using the RF pulsing may help generating high energetic ions (>keV) in the plasma for the plasma etch process, while reducing a charging effect. The charging effect during a process is a phenomenon where electrons build charge on insulating materials (e.g., silicon oxide of the dielectric layer 110) creating a local electric field that may steer charged ions to the sidewalls and cause a non-vertical etching. Therefore, fine tuning the power conditions of the plasma etch process may also be important to minimize the widening of critical dimension (CD) and profile distortion of the high aspect ratio (HAR) feature. In certain embodiments, a kHz modulated dual frequency RF generator is used to power the plasma, with typical pulsing duty ratio between 20% and 90%. In one embodiment, a bias power of 40 MHz at 2 kW, and 400 kHz at 18 kW may be pulsed with a frequency of 5 kHz and a duty ratio of 50%.

For plasma etching a dielectric layer with a plasma as discussed in various embodiments, a capacitively coupled plasma (CCP) may be advantageous over an inductively coupled plasma (ICP) so as to achieve better anisotropic etching and improved etch profile with a controllable range of distortion while maintaining good etch selectivity. However, the methods of HARC etching may be applied to any type of plasma processing system (e.g., CCP, ICP, microwave, etc.).

Figure 2:
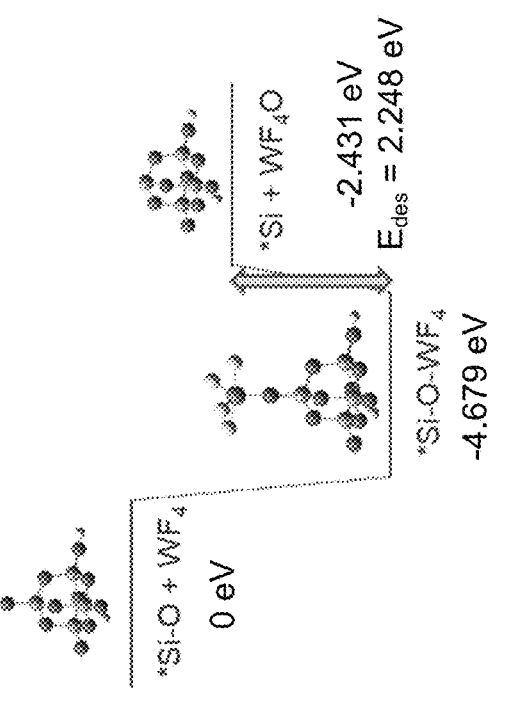
FIG. 2 illustrates an energy level diagram for adsorption/desorption of a metal fluoride species ($WF_4$) on silicon oxide surface.

FIG. 2 illustrates an energy level diagram for adsorption/desorption of a metal fluoride species ($WF_4$) on silicon oxide surface.

Figure 3:
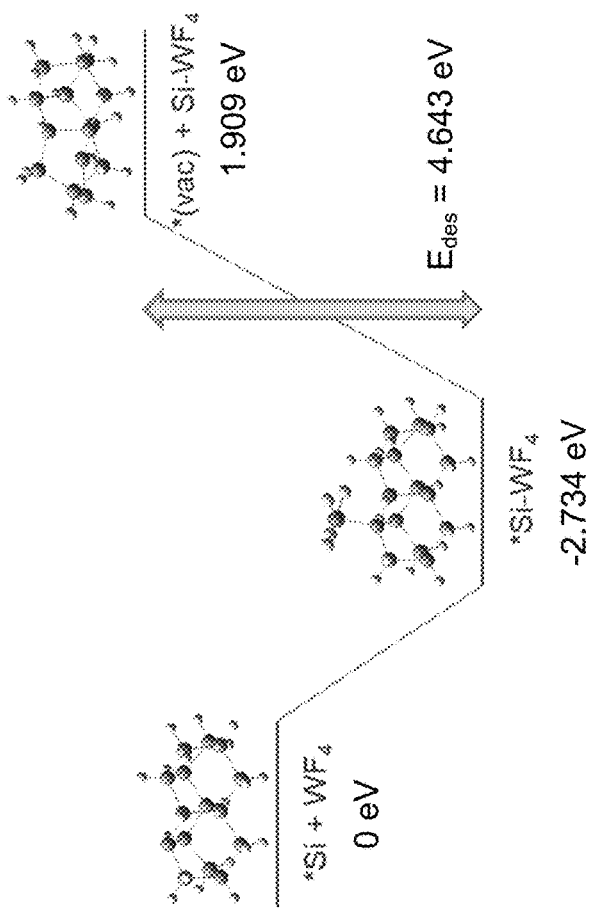
FIG. 3 illustrates an energy level diagram for adsorption/desorption of a metal fluoride species ($WF_4$) on silicon surface.

FIG. 3 illustrates an energy level diagram for adsorption/desorption of a metal fluoride species ($WF_4$) on silicon surface.

The inventors of this application calculated through simulation the adsorption/desorption energy of a possible surface species to demonstrate the effect of the additive gas to the plasma etch process in various embodiments. As illustrated inn FIGS. 2 and 3, the desorption energy for a surface metal fluoride species ($WF_4$) from silicon (4.643 eV) is shown to be more than twice of the desorption energy of $WF_4$ from silicon oxide (2.248 eV). This distinct contrast in desorption energy demonstrates that a surface metal fluoride species ($WF_4$) may be energetically favored over silicon than silicon oxide. Accordingly, it may be suggested that a passivation layer comprising a metal fluoride species during the plasma etch process may selectively occur on the mask material comprising poly-Si than the etch target comprising silicon oxide. In other words, for a high aspect ratio (HAR) etch process, species derived from the additive gas may be more "sticking" to near the top portion of the substrate (e.g., the mask layer) compared to the bottom portion of the substrate (e.g., the etch front of the etch target layer). Such a selective deposition of a passivation layer may be advantageous in preventing any adverse effect on the oxide etch rate, while improving the mask selectivity.

The inventors of this application further confirmed through control experiments that an excellent mask selectivity may be obtained with the addition of $WF_6$ to a fluorine-based plasma etch process. In one embodiment, a silicon oxide-to-poly-Si etch selectivity over 180 may be achieved. In another embodiment, an oxide-to-nitride etch selectivity may be improved by at least a factor of two by adding $WF_6$.

Figure 4:
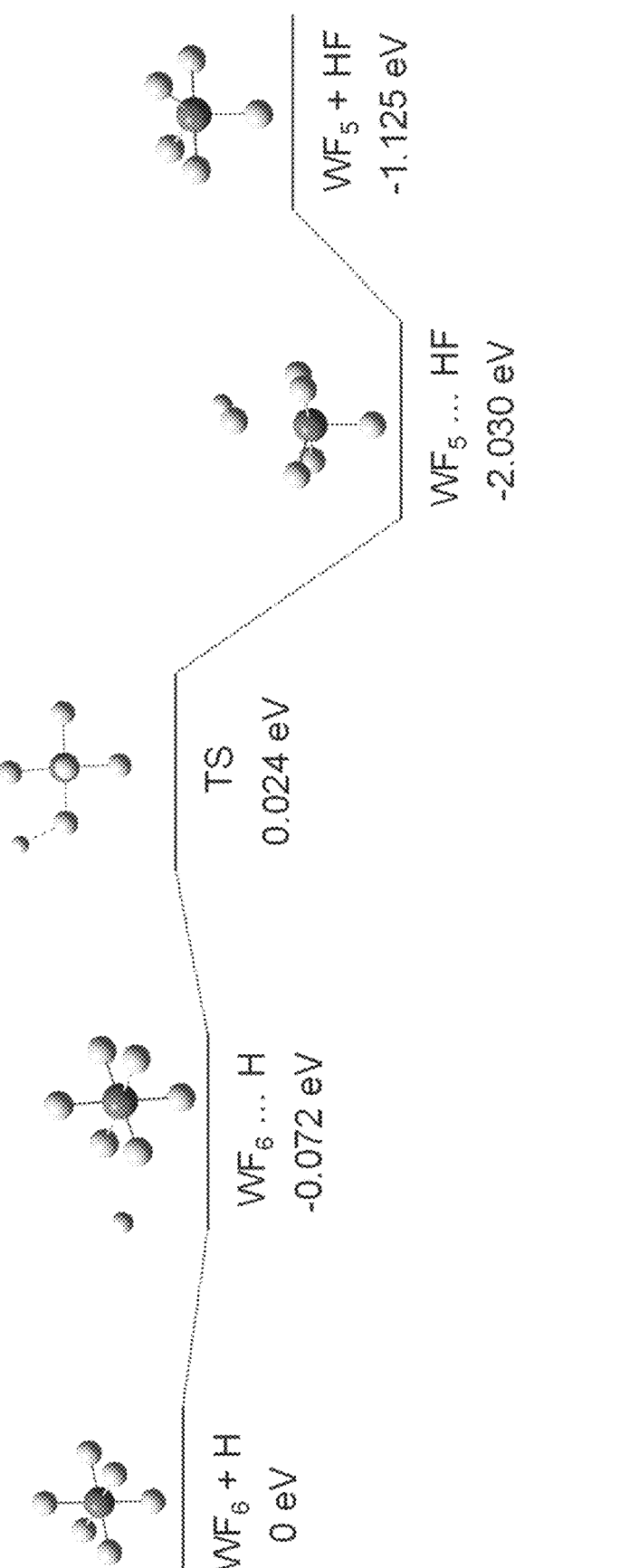
FIG. 4 illustrates an energy level diagram for formation of a deposition precursor ($WF_5$) from a metal fluoride species ($WF_6$) via heavy-particle-assisted dissociation.

FIG. 4 illustrates an energy level diagram for formation of a deposition precursor ($WF_5$) from a metal fluoride species ($WF_6$) via heavy-particle-assisted dissociation.

FIG. 5 illustrates an energy level diagram for formation of a deposition precursor ($SiH_3$) from a silane species ($SiH_4$) via a heavy-particle-assisted dissociation.

The inventors of this application also calculated through simulation the formation energy of a possible deposition precursor from an additive gas component to demonstrate a possible reaction pathway for deposition. Since the stable form of the metal halide (e.g., $WF_6$) or silane compound (e.g., $SiH_4$) may be unlikely to directly form a deposit layer on surface due to its closed-shell structure and absence of dangling bond, it may first need to form a deposition precursor, for example via dissociation, under a plasma condition. The inventors of this application identified that such a dissociation may not only be induced by electron impact but also be enhanced by the collision with a heavy particle (e.g., Hatom). By including a secondary additive such as $H_2$, this heavy-particle-assisted dissociation may further increase the probability of dissociation of the metal halide. In FIG. 4, the calculated energy level diagram demonstrates a thermodynamically favored process (−1.125 eV) of a possible deposition precursor ($WF_5$) induced by the reaction between $WF_6$ and H atom. The activation energy to form a transition state (TS) was also found to be small (0.024 eV). It should be noted that a successive dissociation via the same heavy-particle-assisted dissociation (i.e., $WF_n$+ $H \rightarrow WF_{n-1}$+HF) may occur and produce reactive deposition precursors. As a result, in various embodiments with the use of the secondary additive such as $H_2$, a greater amount of $WF_x$ radicals may advantageously be produced without increasing the flow rate of $WF_6$ or increasing source power of the plasma.

In contrast to the metal halide, the silane compound may be dissociated relatively easily without the aid of a secondary additive gas. This is because the silane compound may react directly with fluorine species in the plasma for dissociation. As illustrated in FIG. 5, the calculated energy level diagram demonstrates a thermodynamically favored process (−1.418 eV) of a possible deposition precursor ($SiH_3$) induced by the reaction between $SiH_4$ and F atom. A successive dissociation via the same heavy-particle-assisted dissociation (i.e., $SiH_n$+F$\rightarrow SiH_{n-1}$+HF) may occur and produce reactive deposition precursors.

As described above, various embodiments of the methods of a plasma etch process may be used to fabricate a HAR feature useful for 3D memory devices such as a 3D-NAND (or vertical-NAND), 3D-NOR, or dynamic random access memory (DRAM) device, or other semiconductor devices including logic devices. The additive gas that can enhance the mask selectivity may comprise a combination of a metal fluoride and a hydrogen-containing gas, or a silane compound. In certain embodiments, it is possible to use both the metal fluoride and the silane compound together for the additive gas. In one embodiment, the process gas may comprise a fluorocarbon, $WF_6$, and $SiH_4$, with or without other gas components (e.g., $O_2$, $H_2$, Ar, or $NF_3$). In such an embodiment, the passivation layer formed during the plasma process may comprise both the metal and silicon from the additive gas.

In further embodiments, the process gas composition may be dynamically adjusted during the plasma etch process. In one or more embodiments, both the metal halide and the silane compound may be used in the process gas, and their flow rates may be individually controlled while the constant total gas flow rate of the process gas may be maintained. Various other process parameters such as process time, substrate temperature, plasma source power, and bias power may also be adjusted accordingly to a process recipe depending on its application.

FIGS. 6A-6C illustrate process flow charts of methods of a plasma etch process in accordance with various embodiments. The process flow can be followed with the figures (FIGS. 1A-1C) discussed above and hence will not be described again.

In FIG. 6A, a process flow 60 starts with flowing a fluorocarbon, a metal halide, and dihydrogen ($H_2$) into a plasma processing chamber that is configured to hold a substrate comprising a dielectric layer comprising silicon oxide as an etch target and a patterned hardmask comprising polycrystalline silicon (poly-Si) over the dielectric layer (block 610, FIG. 1A). Subsequently, while flowing the gases, a plasma may be generated in the plasma processing chamber (block 620), and a high aspect ratio (HAR) feature may be formed by exposing the substrate to the plasma to etch a recess in the dielectric layer, where a metal-containing passivation layer is formed over the patterned hardmask during the exposing (block 630, FIGS. 1B and 1C).

In FIG. 6B, another process flow 62 starts with flowing a fluorocarbon and a silane compound into a plasma processing chamber that is configured to hold a substrate comprising a dielectric layer comprising silicon as an etch target and a patterned hardmask comprising over the dielectric layer (block 612, FIG. 1A). Subsequently, while flowing the gases, a plasma may be generated in the plasma processing chamber (block 620), and a HAR feature may be formed by exposing the substrate to the plasma to etch a recess in the dielectric layer, where a silicon-containing passivation layer is formed over the patterned hardmask during the exposing (block 632, FIGS. 1B and 1C).

In FIG. 6C, yet another process flow 64 starts with flowing a fluorocarbon into a plasma processing chamber that is configured to hold a substrate comprising a dielectric layer as an etch target and a patterned hardmask over the dielectric layer (block 614, FIG. 1A). Subsequently, while flowing the fluorocarbon, a plasma may be generated from the fluorocarbon and sustained in the plasma processing chamber (block 624). While sustaining the plasma, a metal halide and $H_2$ may be flowed into the plasma processing chamber (block 626), and a silane compound may also flowed into the plasma processing chamber (block 628). Subsequently, a HAR feature may then be formed by exposing the substrate to the plasma to etch a recess in the dielectric layer, where a passivation layer is formed over the patterned hardmask during the exposing (block 634, FIGS. 1B and 1C).

FIG. 7 illustrates an example capacitively coupled plasma (CCP) processing tool 70 in accordance with an embodiment of this disclosure.

For illustrative purposes, FIG. 7 illustrates a substrate 100 placed on a substrate holder 754 (e.g., a circular electrostatic chuck (ESC)) inside a plasma processing chamber 710 near the bottom. The substrate 100 may be optionally maintained at a desired temperature using a heater/cooler 756 that surrounds the substrate holder 754. The temperature of the substrate 100 may be maintained by a temperature controller 740 connected to the substrate holder 754 and the heater/cooler 756. The ESC may be coated with a conductive material (e.g., a carbon-based or metal-nitride based coating) so that electrical connections may be made to the substrate holder 754.

As illustrated in FIG. 7, the substrate holder 754 may be a bottom electrode of the plasma processing chamber 710. In the illustrative example in FIG. 7, the substrate holder 754 is connected to two RF-bias power sources, 770 and 780 through blocking capacitors 790 and 791. In some embodiment, a conductive circular plate inside the plasma processing chamber 710 near the top is the top electrode 752. In FIG. 7, the top electrode 752 is connected to a DC power source 750 of the plasma processing system 70.

The gases may be introduced into the plasma processing chamber 710 by a gas delivery system 720. The gas delivery system 720 comprises multiple gas flow controllers to control the flow of multiple gases into the chamber. Each of the gas flow controllers of the gas delivery system 720 may be assigned for each of fluorocarbons, noble gases, or balancing agents. In some embodiments, optional center/ edge splitters may be used to independently adjust the gas flow rates at the center and edge of the substrate 100.

The RF-bias power sources 770 and 780 may be used to supply continuous wave (CW) or pulsed RF power to sustain the plasma, such as a plasma 760. The plasma 760, shown between the top electrode 752 and the bottom electrode (also the substrate holder 754), exemplifies direct plasma generated close to the substrate 100 in the plasma processing chamber 710 of the plasma processing system 70. Etching may be performed by exposing the substrate 100 to the plasma 760 while powering the substrate holder 754 with RF-bias power sources 770, 780 and optionally the top electrode 752 with the DC power source 750.

The configuration of the plasma processing system 70 described above is by example only. In alternative embodiments, various alternative configurations may be used for the plasma processing system 70. For example, instead of the CCP in FIG. 7, inductively coupled plasma (ICP) may be used with RF source power coupled to a planar coil over a top dielectric cover, the gas inlet or the gas outlet may be coupled to the upper wall, etc. In various embodiments, the RF power, chamber pressure, substrate temperature, gas flow rates and other plasma process parameters may be selected in accordance with the respective process recipe. In some embodiments, the plasma processing system 70 may be a resonator such as a helical resonator.

Although not described herein, embodiments of the present invention may be also applied to remote plasma systems as well as batch systems. For example, the substrate holder may be able to support a plurality of wafers that are spun around a central axis as they pass through different plasma zones.

Example embodiments of the invention are summarized here. Other embodiments can also be understood from the entirety of the specification as well as the claims filed herein.

Example 1. A method of processing a substrate that includes: flowing a fluorocarbon, a metal halide, and dihydrogen ($H_2$) into a plasma processing chamber, the plasma processing chamber configured to hold a substrate including a dielectric layer including silicon oxide as an etch target and a patterned hardmask including polycrystalline silicon (poly-Si) over the dielectric layer; while flowing the gases, generating a plasma in the plasma processing chamber; and forming a high aspect ratio feature by exposing the substrate to the plasma to etch a recess in the dielectric layer, where a metal-containing passivation layer is formed over the patterned hardmask during the exposing.

Example 2. The method of example 1, further including flowing dioxygen ($O_2$).

Example 3. The method of one of examples 1 or 2, where the fluorocarbon includes $C_4F_6$, $C_4F_8$, $CF_4$, $C_3F_8$, $CHF_3$, or $CH_2F_2$.

Example 4. The method of one of examples 1 to 3, where the metal halide is tungsten hexafluoride ($WF_6$).

Example 5. The method of one of examples 1 to 4, where the metal halide is molybdenum hexafluoride ($MoF_6$), niobium hexafluoride ($NbF_6$), tungsten hexachloride ($WCl_6$), aluminum trichloride ($AlCl_3$), or titanium tetrachloride ($TiCl_4$).

Example 6. The method of one of examples 1 to 5, where a flow rate of the metal halide is between 0.01% and 1% of a total flow rate of the gases.

Example 7. The method of one of examples 1 to 6, where the metal halide is flowed intermittently while exposing the substrate to the plasma.

Example 8. The method of one of examples 1 to 7, where the dielectric layer includes a layer stack of silicon oxide and silicon nitride.

Example 9. The method of one of examples 1 to 8, where an aspect ratio of the recess is at least 50:1.

Example 10. A method of processing a substrate that includes: flowing a fluorocarbon and a silane compound into a plasma processing chamber, the plasma processing chamber configured to hold a substrate including a dielectric layer including silicon as an etch target and a patterned hardmask including over the dielectric layer; while flowing the gases, generating a plasma in the plasma processing chamber; and forming a high aspect ratio feature by exposing the substrate to the plasma to etch a recess in the dielectric layer, where a silicon-containing passivation layer is formed over the patterned hardmask during the exposing.

Example 11. The method of example 10, further including flowing dioxygen ($O_2$).

Example 12. The method of one of examples 10 or 11, where the fluorocarbon includes $C_4F_6$, $C_4F_8$, $CF_4$, $C_3F_8$, $CHF_3$, or $CH_2F_2$.

Example 13. The method of one of examples 10 to 12, where the silane compound is monosilane ($SiH_4$).

Example 14. The method of one of examples 10 to 13, where the silane compound is disilane ($Si_2H_6$) or halogenated silane ($SiH_xX_y$).

Example 15. The method of one of examples 10 to 14, where the dielectric layer includes silicon oxide.

Example 16. The method of one of examples 10 to 15, where the dielectric layer includes silicon nitride.

Example 17. The method of one of examples 10 to 16, the patterned hardmask includes a polycrystalline silicon (poly-Si).

Example 18. A method of processing a substrate that includes: flowing a fluorocarbon into a plasma processing chamber, the plasma processing chamber configured to hold a substrate including a dielectric layer as an etch target and a patterned hardmask over the dielectric layer; while flowing the fluorocarbon, sustaining a plasma generated from the fluorocarbon in the plasma processing chamber; while sustaining the plasma, flowing a metal halide and dihydrogen ($H_2$) into the plasma processing chamber; while sustaining the plasma, flowing a silane compound into the plasma processing chamber; and forming a high aspect ratio feature by exposing the substrate to the plasma to etch a recess in the dielectric layer, where a passivation layer is formed over the patterned hardmask during the exposing.

Example 19. The method of example 18, where the metal halide, $H_2$, and the silane compound are flowed into the plasma processing chamber simultaneously.

Example 20. The method of one of examples 18 or 19, further including alternately repeating the flowing of the metal halide and $H_2$, and the flowing of the silane compound.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:

flowing a fluorocarbon gas, a metal halide gas, and dihydrogen ($H_2$) gas into a plasma processing chamber, the plasma processing chamber configured to hold a substrate comprising a dielectric layer comprising silicon oxide as an etch target and a patterned hardmask comprising polycrystalline silicon (poly-Si) over the dielectric layer;
while flowing the gases, generating a plasma in the plasma processing chamber; and
forming a high aspect ratio feature by exposing the substrate to the plasma to etch a recess in the dielectric layer, wherein a metal-containing passivation layer is selectively formed over a top surface and sidewalls of the patterned hardmask relative to sidewalls of the dielectric layer during the exposing.

2. The method of claim 1, further comprising flowing dioxygen ($O_2$).

3. The method of claim 1, wherein the fluorocarbon gas comprises $C_4F_6$, $C_4F_8$, $CF_4$, $C_3F_8$, $CHF_3$, or $CH_2F_2$.

4. The method of claim 1, wherein the metal halide gas is tungsten hexafluoride ($WF_6$).

5. The method of claim 1, wherein the metal halide gas is molybdenum hexafluoride ($MoF_6$), niobium hexafluoride ($NbF_6$), tungsten hexachloride ($WCl_6$), aluminum trichloride ($AlCl_3$), or titanium tetrachloride ($TiCl_4$).

6. The method of claim 1, wherein a flow rate of the metal halide gas is between 0.01% and 1% of a total flow rate of the gases.

7. The method of claim 1, wherein the metal halide gas is flowed intermittently while exposing the substrate to the plasma.

8. The method of claim 1, wherein the dielectric layer comprises a layer stack of silicon oxide and silicon nitride.

9. The method of claim 1, wherein an aspect ratio of the recess is at least 50:1.

10. The method of claim 1, further comprising, while generating the plasma, flowing a silane compound into the plasma processing chamber.

11. A method of processing a substrate, the method comprising:
flowing a fluorocarbon gas and a silane compound gas into a plasma processing chamber, the plasma processing chamber configured to hold a substrate comprising a dielectric layer comprising silicon as an etch target and a patterned hardmask over the dielectric layer;
while flowing the gases, generating a plasma in the plasma processing chamber; and
forming a high aspect ratio feature by exposing the substrate to the plasma to etch a recess in the dielectric layer, wherein a silicon-containing passivation layer is formed selectively over a top surface and sidewalls of the patterned hardmask relative to sidewalls of the dielectric layer during the exposing.

12. The method of claim 11, further comprising flowing dioxygen ($O_2$).

13. The method of claim 11, wherein the fluorocarbon gas comprises $C_4F_6$, $C_4F_8$, $CF_4$, $C_3F_8$, $CHF_3$, or $CH_2F_2$.

14. The method of claim 11, wherein the silane compound gas is monosilane ($SiH_4$).

15. The method of claim 11, wherein the silane compound gas is disilane ($Si_2H_6$) or halogenated silane ($SiH_xX_y$).

16. The method of claim 11, wherein the dielectric layer comprises silicon oxide.

17. The method of claim 11, wherein the dielectric layer comprises silicon nitride.

18. The method of claim 11, wherein the patterned hardmask comprises a polycrystalline silicon (poly-Si).

19. The method of claim 11, further comprising, while generating the plasma, flowing a metal halide and dihydrogen ($H_2$) into the plasma processing chamber.

20. A method of processing a substrate, the method comprising:
flowing a fluorocarbon into a plasma processing chamber, the plasma processing chamber configured to hold a substrate comprising a dielectric layer as an etch target and a patterned hardmask over the dielectric layer;
while flowing the fluorocarbon, sustaining a plasma generated from the fluorocarbon in the plasma processing chamber;
while sustaining the plasma, flowing a metal halide and dihydrogen ($H_2$) into the plasma processing chamber;
while sustaining the plasma, flowing a silane compound into the plasma processing chamber; and
forming a high aspect ratio feature by exposing the substrate to the plasma to etch a recess in the dielectric layer, wherein a passivation layer is formed selectively over a top surface and sidewalls of the patterned hardmask relative to sidewalls of the dielectric layer during the exposing of the substrate.

21. The method of claim 20, wherein the metal halide, $H_2$, and the silane compound are flowed into the plasma processing chamber simultaneously.

22. The method of claim 20, further comprising alternately repeating the flowing of the metal halide and $H_2$, and the flowing of the silane compound.

* * * * *